United States Patent
Wong et al.

(10) Patent No.: US 7,018,877 B1
(45) Date of Patent: Mar. 28, 2006

(54) SELECTIVE DELAMINATION OF THIN-FILMS BY INTERFACE ADHESION ENERGY CONTRASTS AND THIN FILM TRANSISTOR DEVICES FORMED THEREBY

(75) Inventors: William Wong, San Carlos, CA (US); Chinwen Shih, Santa Clara, CA (US); Rene A. Lujan, Sunnyvale, CA (US); Eugene Chow, Mountain View, CA (US)

(73) Assignee: Palo Alto Research Center, Palo Alto, CA (US)

( * ) Notice: Subject to any disclaimer, the term of this patent is extended or adjusted under 35 U.S.C. 154(b) by 0 days.

(21) Appl. No.: 10/950,413

(22) Filed: Sep. 28, 2004

(51) Int. Cl.
 *H01L 21/77* (2006.01)
 *H01L 29/786* (2006.01)

(52) U.S. Cl. ...................................... 438/158; 257/288
(58) Field of Classification Search ................. 438/158; 257/288
See application file for complete search history.

(56) References Cited

U.S. PATENT DOCUMENTS

| | | | | |
|---|---|---|---|---|
| 4,663,820 | A | * | 5/1987 | Ionescu ...................... 438/655 |
| 5,527,726 | A | * | 6/1996 | Possin et al. ................ 438/159 |
| 5,795,821 | A | * | 8/1998 | Bacchetta et al. ........... 438/624 |
| 6,124,185 | A | * | 9/2000 | Doyle .......................... 438/458 |
| 6,524,971 | B1 | * | 2/2003 | Fetter et al. ................. 438/778 |

* cited by examiner

*Primary Examiner*—Evan Pert
(74) *Attorney, Agent, or Firm*—Oliff & Berridge, PLC

(57) ABSTRACT

Various exemplary embodiments of the systems and methods according to this invention provide for a method of producing a self-aligned thin film transistor, the transistor including a metal layer covering at least a portion of a doped layer, the doped layer covering at least a portion of a dielectric layer, a strain being created in the metal layer, the method includes etching an exposed portion of the doped layer to create a defect at an interface between the doped layer and the dielectric layer so as to initiate a delamination of the doped layer from the dielectric layer. The delamination of the doped layer from the dielectric layer is stopped when the defect propagates into an interface between the doped layer and the dielectric layer that has an adhesive energy that is greater than the strain of the metal layer.

34 Claims, 6 Drawing Sheets

SELECTIVE DELAMINATION OF THIN-FILMS BY INTERFACE ADHESION ENERGY CONTRASTS AND THIN FILM TRANSISTOR DEVICES FORMED THEREBY

BACKGROUND OF THE INVENTION

1. Field of Invention

This invention relates to the manufacture of thin films, and more particularly to the manufacture of self-aligned thin film transistors.

2. Description of Related Art

The patterning of thin film features generally found in microelectronics applications are normally achieved using, for instance, conventional photolithographic and etching processes typically. In the case of thin film transistors, self-aligned transistor structures are generally fabricated using, for example, laser processing, in order to selectively pattern source contact and drain contact and to achieve minimum overlap between the source electrode, the drain electrode and the gate electrode. Moreover, laser processing photolithography is usually complicated because it requires deposition of multilayer thin film mirror stacks to define device features that will subsequently be laser irradiated.

SUMMARY OF THE INVENTION

In light of the above-described problems and shortcomings, various exemplary embodiments of the system and methods according to this invention provide for a method of separating a film from a substrate. The method including at least providing a first film on a substrate, providing a second film adjacent to the first film in a longitudinal direction, providing an intrinsically stressed third film over the first and second films, the third film having an interfacial fracture toughness to the first film that is lower than the interfacial fracture toughness of the third film to the second film, and creating a defect at an interface between the third film and the first film in order to initiate a delamination of the third film from the first film because of the strain present in the intrinsically stressed third film.

Moreover, various exemplary embodiments of the systems and methods according to this invention also provide for a method of separating a metal layer and a doped layer such as, for instance, a doped semiconductor layer, from a dielectric layer in a structure that includes the metal layer provided on the doped layer, the metal layer and the doped layer partially covering the dielectric layer. The method includes at least providing a defect at an interface between the doped layer and the dielectric layer and separating the doped layer and overlaying metal layer from the dielectric layer by creating a strain on at least one of the doped layer and the metal layer.

Also, various exemplary embodiments of the methods of this invention also provide for a method of producing a self-aligned thin film transistor, the transistor including a doped layer covering a dielectric layer, and a metal layer covering at least a portion of the doped layer, a strain being created in the metal layer, the method including etching at least a portion of the doped layer that covers a central portion of the dielectric layer and that is not covered by the metal layer so as to create a defect at an interface between the doped layer and the dielectric layer to initiate a delamination of the doped layer and overlaying metal layer from the dielectric layer.

Finally, various exemplary embodiments of the systems of this invention provide for a self-aligned thin film transistor device that includes a first layer, a dielectric layer provided over at least a portion of the first layer, a doped layer provided over a portion of the first layer that is not covered by the dielectric layer, the doped layer being adjacent to at least one substantially vertical surface of the dielectric layer, and a metal layer provided over the doped layer, wherein any portion of the metal layer and the doped layer that covers any non-vertical portion of the dielectric layer surface is removed by a delamination initiated by the creation of a defect at an interface between the doped layer and the dielectric layer surface.

BRIEF DESCRIPTION OF THE DRAWINGS

Various exemplary embodiments of the systems and methods of this invention will be described in detail, with reference to the following figures, wherein.

DETAILED DESCRIPTION OF PREFERRED EMBODIMENTS

These and other features and advantages of this invention are described in, or are apparent from, the following detailed description of various exemplary embodiments of the systems and methods according to this invention.

Figure 1:
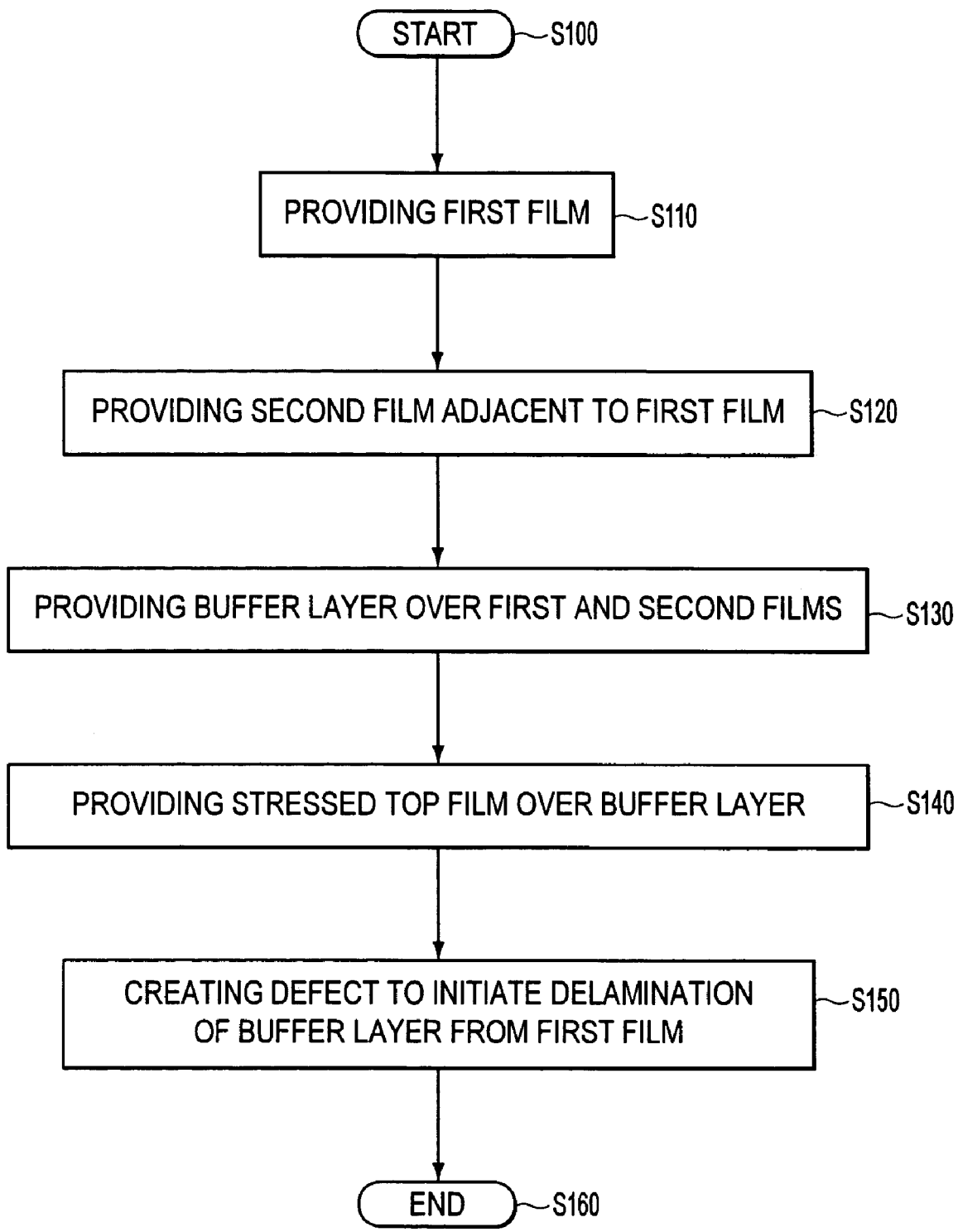
FIG. 1 is a flowchart illustrating a method of selective delamination of thin films according to various exemplary embodiments of this invention.

FIG. 1 is a flowchart illustrating a method of selective delamination of thin films according to various exemplary embodiments of this invention. The method starts with step S100 and continues to step S110, during which a first film is provided. According to various exemplary embodiments, the first film is provided over a substrate. Next, at step S120, a second film is also provided over the same substrate. During step S120, a second film is provided on the substrate and, according to various exemplary embodiments, is adjacent to the first film that was provided on the substrate during step S110. According to various exemplary embodiments, the first film and the second film have dissimilar surface energies. Accordingly, two interfaces are created with two dissimilar adhesion energies, a first interface between the first film and the substrate, and a second interface between the second film and the substrate. According to various exemplary embodiments, one interface has a weak adhesive energy compared to the other. Moreover, the applied stress on the film will cause the region with the interface with a weak adhesion energy to delaminate, while the region with the interface with the stronger adhesion energy does not delaminate. According to various exemplary embodiments, the strain in the film can be created by a variety of factors, such as, for instance, residual film stress, thermal expansion coefficient mismatch, lattice mismatch between the two films, and the like. According to various exemplary embodiments, when the film delaminates, the elastic energy per unit area in the released film, or the energy release rate, must be greater than the interfacial fracture toughness at the interface between the two films in order for one film to release.

After the second film is provided adjacent to the first film and over the substrate, control continues to step S130, during which a buffer layer is provided over the first and second films. Next, control continues to step S140, during which a stressed top film layer is provided over the buffer layer. According to various exemplary embodiments, the stressed top film layer has a tensile stress, resulting in a strain energy that is greater than the adhesive energy of the first interface between the first film and the substrate, but the strain energy of the stressed top film layer is less than the adhesion energy between the second film and the substrate.

After the stressed top film layer is provided over the buffer layer during step S140, control continues to step S150. During step S150, a portion of the buffer layer is etched in order to introduce an edge defect which will initiate an energy release through delamination of the interface between the first film and the buffer layer. According to various exemplary embodiments, the delamination can also be initiated by thermal or radiative annealing of the stressed film. Similarly, altering the geometry and roughness of a portion of the underlying surface may create an adhesion energy contrast at the interface with the overlaying stressed film. According to various exemplary embodiments, because the adhesive energy between the first film and the substrate is larger than the strain energy that results from the tensile stress applied to the top film, the delamination will continue along the weak interface between the first film and the buffer layer until the delamination reaches the interface between the second film and the buffer layer. When the delamination reaches the interface between the second film and the buffer layer, the delamination stops. In effect, the interface between the second layer and the buffer layer is anchoring the portion of the buffer layer that is over the second film. According to various exemplary embodiments, the delamination is anchored by the second film because the strain energy of the stressed top film layer is smaller than the adhesive energy at the interface between the second film and the buffer layer. When the delamination of the first film is complete, then control continues to step S160, where the method ends.

Figure 2:
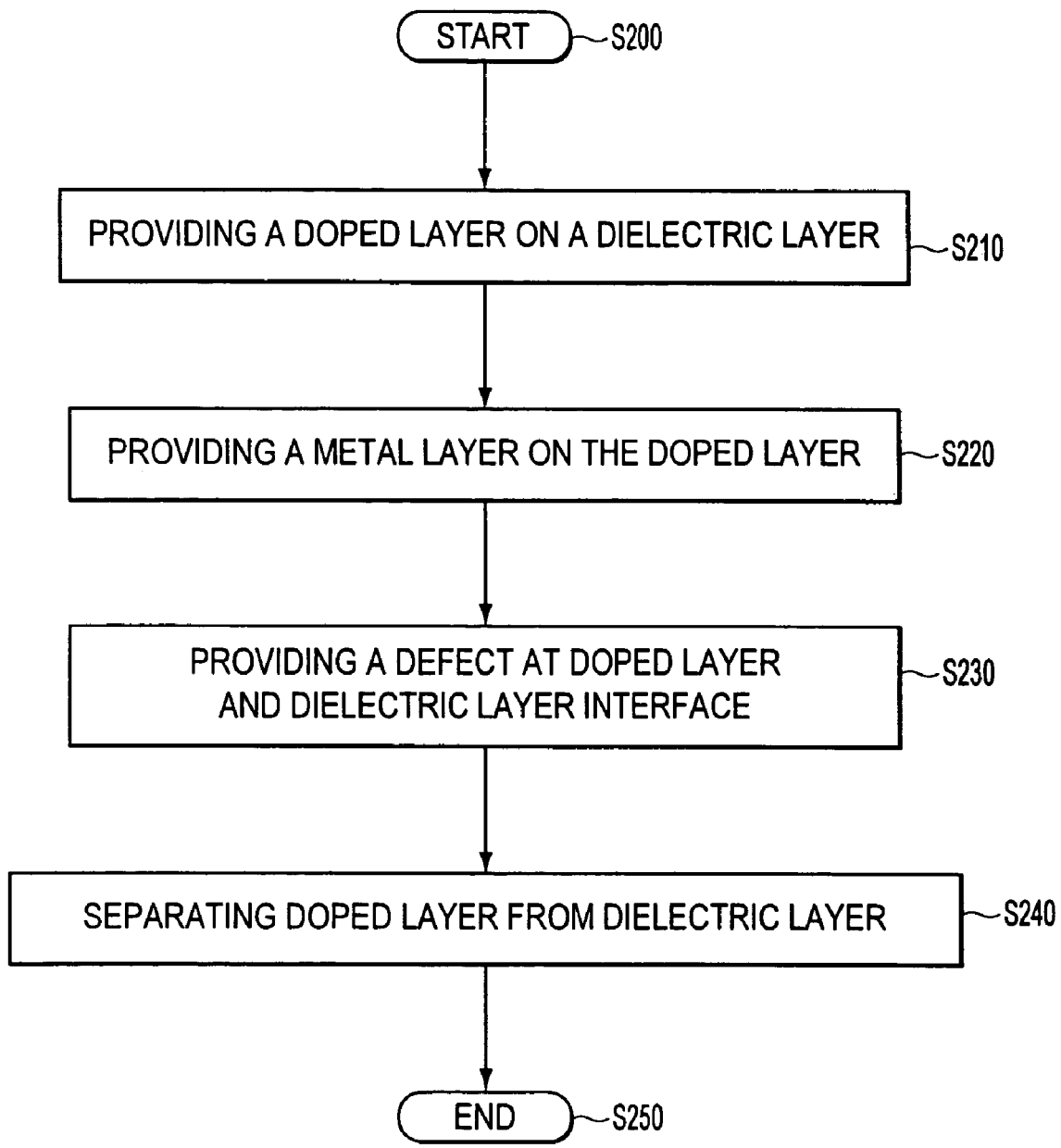
FIG. 2 is a flowchart illustrating a method of selective delamination of a doped layer and a dielectric layer according to various exemplary embodiments of this invention.

FIG. 2 is a flowchart illustrating a method of selective delamination of a doped layer from a dielectric layer, according to various exemplary embodiments of this invention. The method starts in step S200 and continues to step S210, during which a doped layer and a dielectric layer are provided on an amorphous silicon layer. According to various exemplary embodiments of this invention, the amorphous silicon layer is that of a thin film transistor, and the doped layer is provided over the entire surface of the dielectric layer, and extends on each side of the dielectric layer over the amorphous silicon layer. Next, control continues to step S220, during which a metal layer is provided over the doped layer and thus covers both the doped layer and the dielectric layer. The metal layer may then be patterned in order to define source and drain contacts on the thin-film transistor. According to various exemplary embodiments, the metal layer is provided over outside portions of the dielectric layer and extends on each side of the dielectric layer over the doped layer. Accordingly, although the entire dielectric layer is covered by the doped layer, only outside portions of the doped layer are covered by the metal layer, i.e., a central portion of the doped layer and of the dielectric layer is not covered by the metal layer. Next, control continues to step S230, during which a defect is provided at an interface between the doped layer and the dielectric layer in a portion that is not covered by the metal layer.

According to various exemplary embodiments, the defect is created during step S230 by etching away the portion of the doped layer that is not covered by the metal layer. As a result, a central portion of the dielectric layer becomes uncovered by the etching of the overlaying doped layer. Next, control continues to step S240, during which the doped layer and the dielectric layer are separated from each other.

During step S240, the defect created an interface between the doped layer and the dielectric layer during step S230 initiates the separation of the metal and doped semiconductor layer from the dielectric layer by releasing the strain energy accumulated inside the doped layer, forcing the weakly adhering interface to separate. According to various exemplary embodiments, the delamination can also be initiated by thermal or radiative annealing of the stressed film. Similarly, altering the geometry and roughness of a portion of the underlying surface may create an adhesion energy contrast at the interface with the overlaying stressed film. During this step, the delamination propagates along the interface between the doped layer and the dielectric layer until the delamination encounters a region in which the adhesive energy at the interface is higher than the strain energy accumulated inside the doped layer. According to various exemplary embodiments, this region is another portion of the interface between the semiconductor and doped semiconductor layer where the interface toughness of the semiconductor layer to the doped semiconductor layer happens to be greater than its strain energy. As a result, delamination subsides. Next, control continues to step S250, where the methods ends.

Figure 3A:
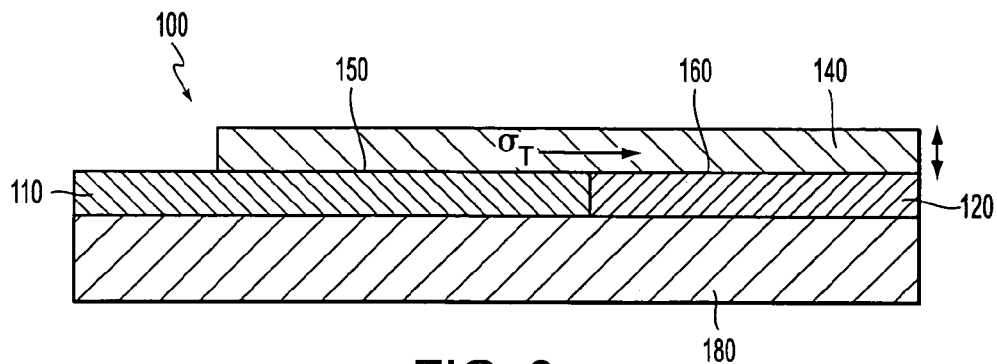
FIGS. 3a–3d schematically illustrate the selective delamination of thin films according to various exemplary embodiments of this invention.

FIGS. 3a–3d schematically illustrate the selective delamination of thin films according to various exemplary embodiments of this invention. As shown in FIG. 3a, a substrate 180 is first covered by a first film 110, and by a second film 120. According to various exemplary embodiments, the first film 110 and the second film 120 possess dissimilar surface energies. According to various exemplary embodiments, the first film 110 and the second film 120 are both provided over the substrate 180, and the first film 110 and the second film 120 are adjacent to each other over the substrate 180. According to various exemplary embodiments, both the first film 110 and the second film 120 are covered by a stressed top film 140.

According to various exemplary embodiments, a strain energy is stored in the stressed top film 140 in which an intrinsic stress is applied, for example, through the method and process of deposition. In this configuration, both the first film 110 and the second film 120 are adjacent to each other over the surface of the substrate 180. The strain energy of the tensile stressed top film 140, according to various exemplary embodiments, is greater than the adhesive energy of the first interface 150, which is the interface between the first film 110 and the stressed top film 140, and the resulting strain energy of the stressed top film 140 is smaller than the adhesive energy of the interface 160, which is the interface between the second film 120 and the stressed top film 140.

Figure 3B:
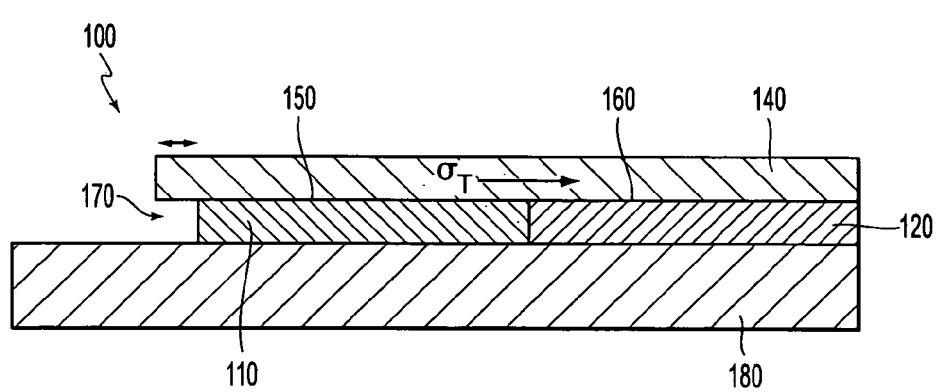

FIG. 3b illustrates the creation of a defect 170 by etching a portion of the first film 110 in order to introduce an edge defect 170 between the stressed top film 140 and the first film 110 so as to initiate an energy release through the delamination of the interface 150 between the first film 110 and the stressed top film 140. According to various exemplary embodiments, the delamination can also be initiated by thermal or radiative annealing of the stressed film. Similarly, altering the geometry and roughness of a portion of the underlying surface may create an adhesion energy contrast at the interface with the overlying stressed film. The energy release is caused by the fact that the resulting released strain energy of the stressed top film 140 is greater than the adhesive energy of the first interface 150. According to various exemplary embodiments, the edge defect will initiate the spontaneous delamination of the stressed top film 140 if the width of the edge defect a of FIG. 3b is smaller than half the height of the stressed top film 140.

Figure 3C:
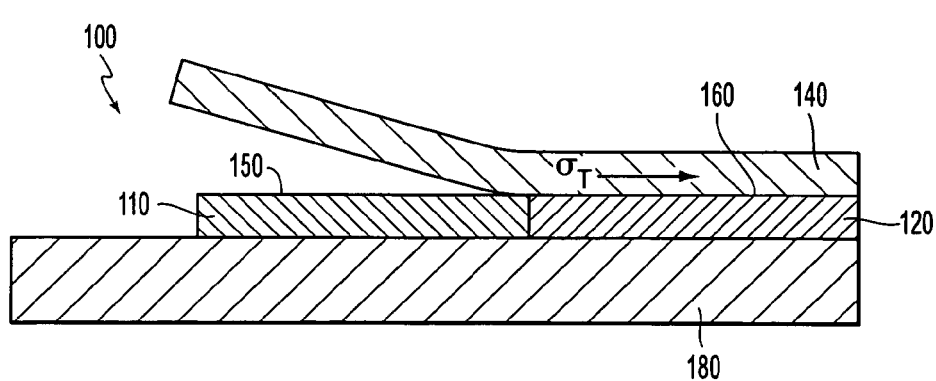

FIG. 3c illustrates the propagation of the delamination along the interface 150 between the first film 110 and the stressed top film 140. The delamination, according to various exemplary embodiments, subsides when it reaches the interface 160 between the second film 120 and the stressed top film 140. The delamination subsides at interface 160 because at interface 160, the strain energy of the stressed top film 140 is smaller than the adhesive energy at interface 160. Thus, according to various exemplary embodiments, the stressed top film 140 is anchored over the second film 120, i.e., the delamination does not propagate over the second film 120.

Figure 3D:
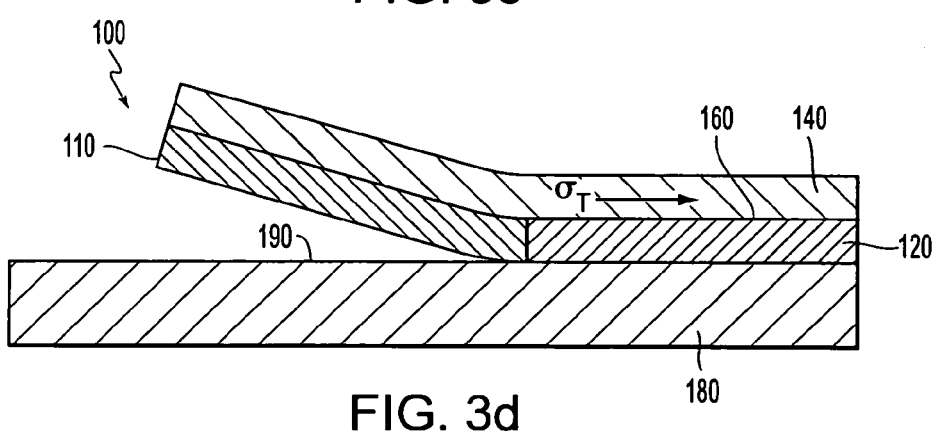

FIG. 3d illustrates the propagation of the delamination along the interface 190 between the first film 110 and the substrate 180. The delamination, according to various exemplary embodiments, subsides when it reaches the interface between the second film 120 and the substrate 180. The delamination subsides because the strain energy of the stressed top film 140 and the second film 120 is smaller than the adhesive energy between the second film 120 and the substrate 180. Thus, according to various exemplary embodiments, the second film 120 is anchored over the substrate 180, i.e., the delamination does not propagate any further.

Figure 4A:
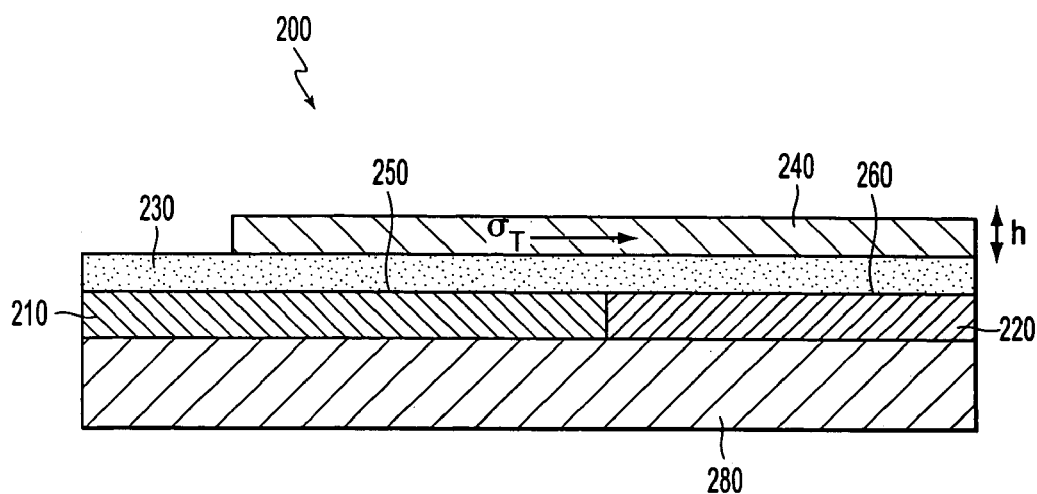
FIGS. 4a–4c schematically illustrate the selective delamination of thin films according to various exemplary embodiments of this invention.
Figure 4B:
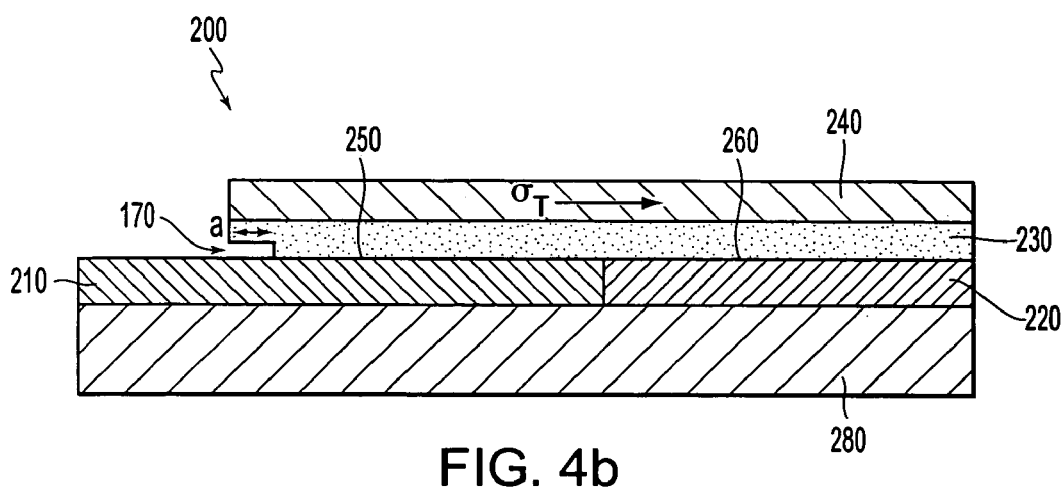
Figure 4C:
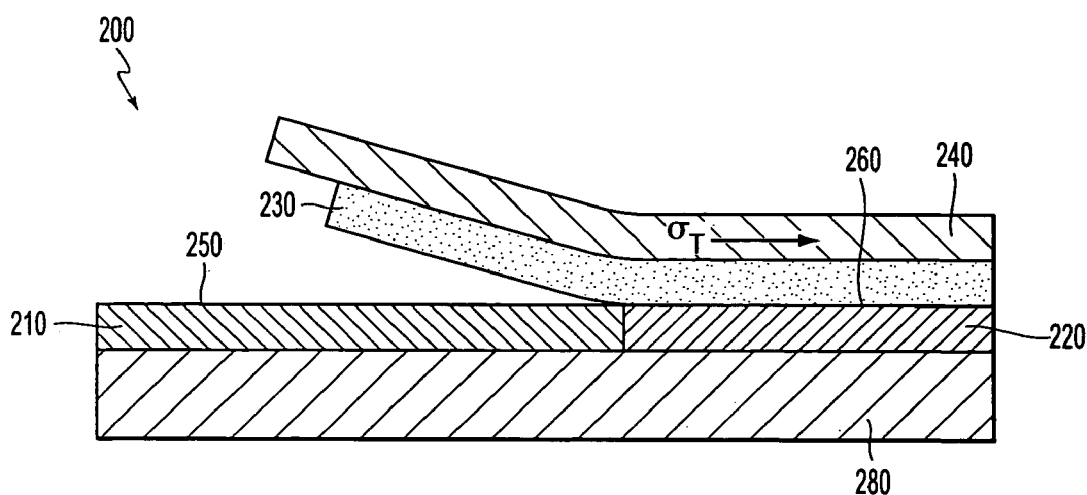

FIGS. 4a–4c schematically illustrate the selective delamination of a thin film 200 according to various exemplary embodiments of this invention. As shown in FIG. 4a, a substrate 280 is first covered by a first film 210, and by a second film 220. According to various exemplary embodiments, the first film 210 and the second film 220 possess dissimilar surface energies. According to various exemplary embodiments, the first film 210 and the second film 220 are both provided over the substrate 280, and the first film 210 and the second film 220 are adjacent to each other over the substrate 280. According to various exemplary embodiments, both the first film 210 and the second film 220 are covered by a buffer layer 230. The buffer layer 230, according to various exemplary embodiments, is covered by a stressed top film 240.

According to various exemplary embodiments, the stressed top film 240 is a film in which a stress is applied, for example, through the method and process of deposition. In this configuration, both the first film 210 and the second film 220 are adjacent to each other over the surface of the substrate 280. The strain energy of the stressed top film 240, according to various exemplary embodiments, is greater than the adhesive energy of the first interface 250, which is the interface between the first film 210 and the buffer layer 230, and the strain energy of the stressed top film 240 is smaller than the adhesive energy of the interface 260, which is the interface between the second film 220 and the buffer layer 230. According to various exemplary embodiments, the strain energy can be a residual stress or a stress gradient.

FIG. 4b illustrates the creation of a defect 270 by etching a portion of the buffer layer 230 in order to introduce an etch defect 270 between the buffer layer 230 and the first film 210 so as to initiate an energy release through the delamination of the interface 250 between the first film 210 and the buffer layer 230. According to various exemplary embodiments, the delamination can also be initiated by thermal or radiative annealing of the stressed film. Similarly, altering the geometry and roughness of a portion of the underlying surface may create an adhesion energy contrast at the interface with the overlying stressed film. The energy release is caused by the fact that the tensile stress and resulting released strain energy of the stressed top film 240 is greater than the adhesive energy of the first interface 250. According to various exemplary embodiments, the edge defect will initiate the spontaneous delamination of the buffer layer 230 if the width of the edge defect a of FIG. 4b is smaller than half the height of the stressed top film 240.

FIG. 4c illustrates the propagation of the delamination along the interface 250 between the first film 210 and the buffer layer 230. The delamination, according to various exemplary embodiments, subsides when it reaches the interface 260 between the second film 220 and the buffer layer 230. The delamination subsides at interface 260 because at interface 260, the strain energy of the stressed top film 240 is smaller than the adhesive energy at interface 260. Thus, according to various exemplary embodiments, the buffer layer 230 is anchored over the second film 220, i.e., the delamination does not propagate over the second film 220.

Figure 5A:
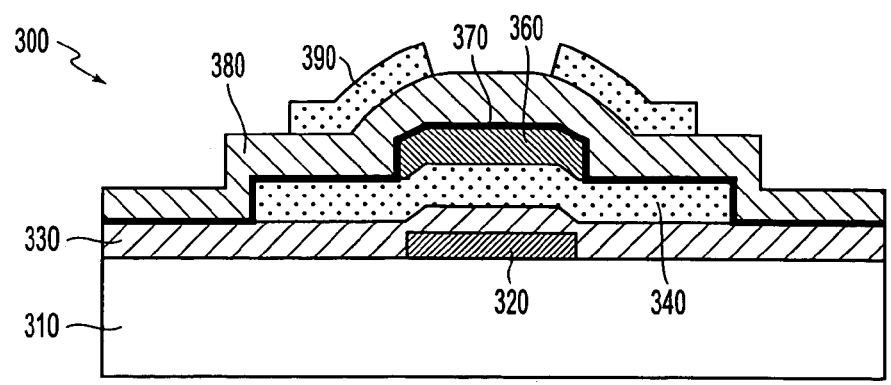
FIGS. 5a–5e schematically illustrate the steps to manufacture a self-aligned semiconductor structure according to various exemplary embodiments of this invention.

FIGS. 5a–5e schematically illustrate manufacturing steps of a self-aligned semiconductor structure according to various exemplary embodiments of this invention. In FIG. 5a, a thin film transistor structure 300 is illustrated, where an amorphous semiconductor layer 340 is partially covered with a dielectric layer 360. According to various exemplary embodiments, the amorphous semiconductor layer 340 is provided over a lower dielectric layer 330. Also, according to various exemplary embodiments, the lower dielectric layer 330 is provided over a first patterned layer 320. According to various exemplary embodiments, both the lower dielectric layer 330 and the first patterned layer 320 are provided over a substrate 310.

According to various exemplary embodiments, the amorphous semiconductor layer 340 is an amorphous silicon layer. Moreover, according to various exemplary embodiments, the dielectric layer 360 is patterned and self-aligned to the patterned metal layer 320 and substantially covered with a doped semiconductor layer 370. According to various exemplary embodiments, the doped semiconductor layer 370 covers the dielectric layer 360, but also covers the amorphous layer 340 on each side of the dielectric layer 360. According to various exemplary embodiments, a metal layer 380 covers the doped semiconductor layer 370. However, according to various exemplary embodiments, the metal layer 380 does not cover a central portion of the doped semiconductor layer 370 on the dielectric layer 360. According to various exemplary embodiments, the metal layer 380 is deposited in such a way as to have a built-in tensile stress or a stress gradient resulting in stored strain energy within the film. According to various exemplary embodiments, the adhesive energy between the doped semiconductor layer 370 and the amorphous semiconductor layer 340 is greater than the adhesive energy between the doped semiconductor layer 370 and the dielectric layer 360.

Figure 5B:
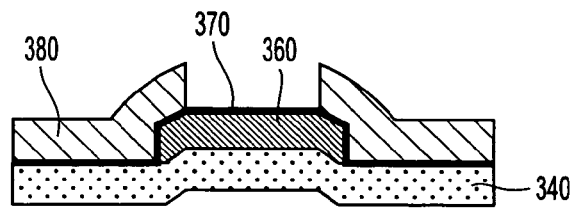
Figure 5C:
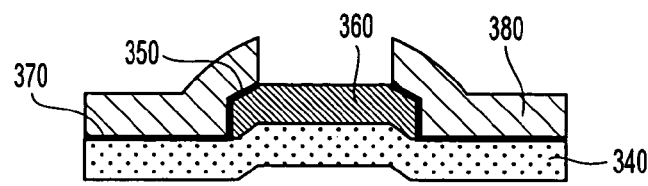

FIGS. 5b–5c illustrate the transistor structure 300 (without 310, 320, 330 shown) when the portion of the doped semiconductor layer 370 that covers the dielectric layer 360 is removed. According to various exemplary embodiments of this invention, an anisotropic wet etch is used to remove the exposed portion of the doped semiconductor layer 370. As a result, an edge defect is introduced at the edge of an interface between the doped semiconductor layer 370 and the dielectric layer 360. Accordingly, when the adhesive energy at the first interface 350 between the patterned metal layer 320 and the dielectric layer 360 is smaller than the strain energy of the tensile stressed metal layer 380, a crack is initiated along the first interface 350. According to various exemplary embodiments, once the crack is initiated, the energy release rate of the metal layer 380 reaches a steady state as the crack propagates across the weak first interface 350, the first interface 350 being the interface between a portion of the doped layer 370 and a non-vertical portion of the dielectric layer 360.

Figure 5D:
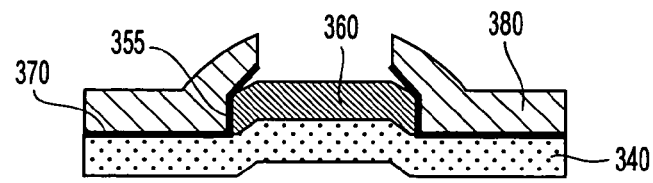

According to various exemplary embodiments, as the crack approaches a second interface 355 which is between the doped semiconductor layer 370 and a vertical portion of the dielectric layer 360, and when the second interface 355 has a higher adhesive energy than the stored strain energy of the stressed metal layer 380, the crack propagation stops, and the delaminated film is anchored at that point, as illustrated in FIG. 5d, which shows that the portion of the doped semiconductor layer 370 and the metal layer 380 that was provided over the first interface 350 is separated from the dielectric layer 360, while the portion of the doped semiconductor layer 370 and the metal layer 380 that is provided over the second interface 355 remains adhered to the amorphous silicon layer 340. According to various exemplary embodiments, the adhesion energy between the doped semiconductor layer 370 and the amorphous silicon layer 340 is substantially higher than the adhesion energy between the doped semiconductor layer 370 and the dielectric layer 360.

Figure 5E:
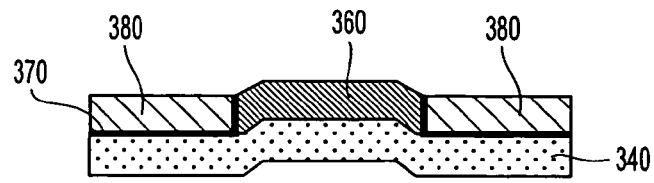

After breaking off the delaminated films that are portions of the metal layer 380 and the doped semiconductor layer 370, the resulting structure, as illustrated in FIG. 5e, is a part of a self-aligned thin film transistor device 300.

Figure 6A:
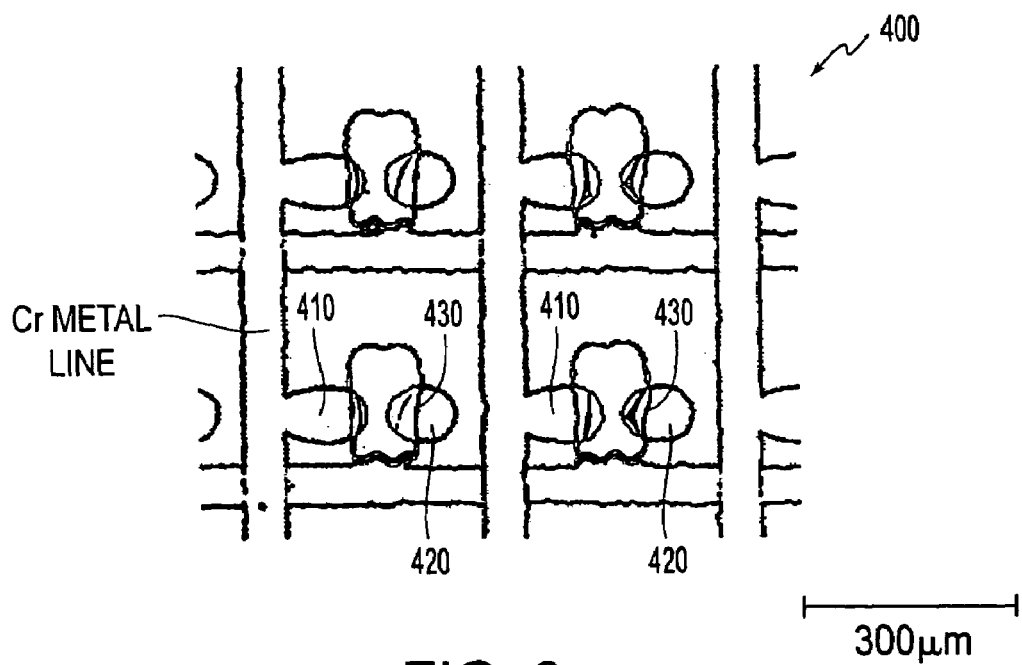
FIGS. 6a–6b schematically illustrate a self-aligned semiconductor device according to various exemplary embodiments of this invention.
Figure 6B:
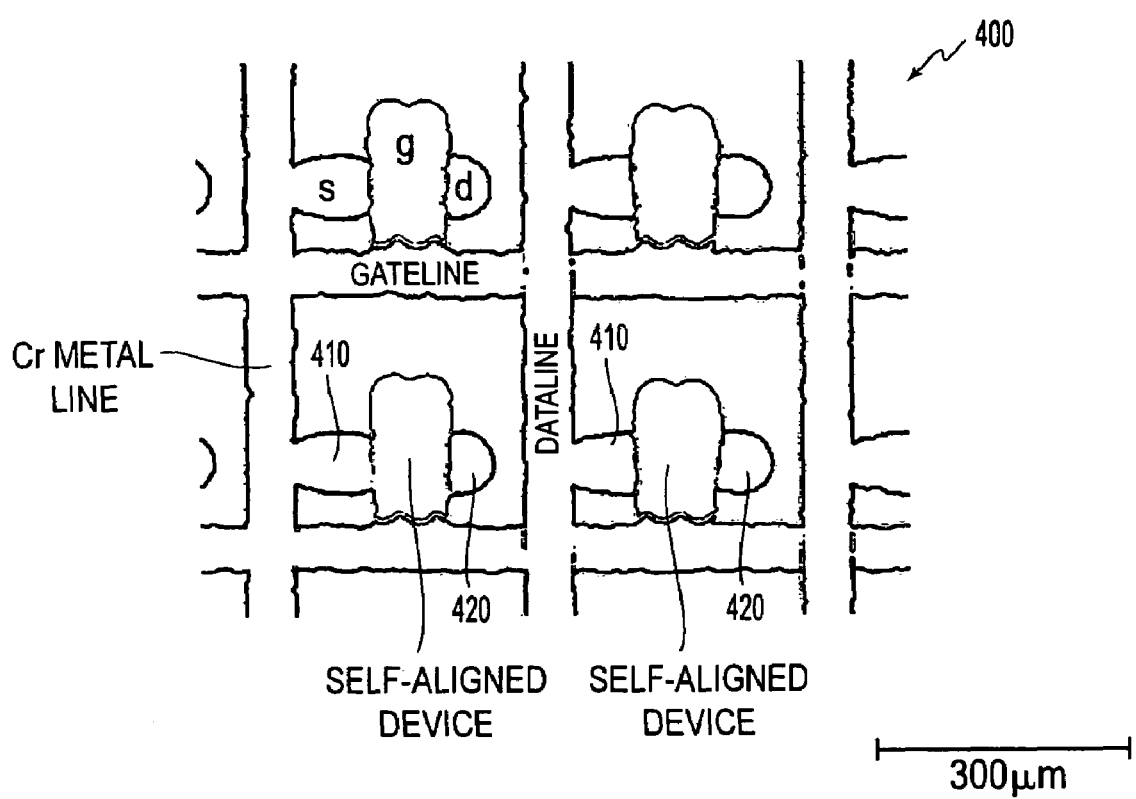

FIGS. 6a–6b schematically illustrate a thin film transistor array 400 according to various exemplary embodiments of this invention. FIG. 6a shows a plan view optical micrograph of an amorphous silicon thin film transistor array 400 after etching of the doped silicon layer. The micrograph shows the source contact 410 and the drain contact 420 over the top dielectric region that have delaminated from the dielectric layer surface. The area over the amorphous silicon region remains intact with portions of the metal layer 430 still dangling from the surface. FIG. 6b shows the same array 400 after rinsing the surface with a stream of water in order to remove the dangling portions of the metal layer 430 that had delaminated from the surface as a result of the manufacturing process. The micrographs illustrated in FIGS. 6a–6b show the metal electrode preferentially adhering to the amorphous silicon region and delaminated off the exposed dielectric layer. According to various exemplary embodiments, the adhesion contrast can be removed if a thin layer of amorphous silicon is deposited between the doped layer and the dielectric layer. According to various exemplary embodiments, the amorphous Si layer acts as an intermediate adhesion layer between the doped layer and the dielectric layer in order to improve adhesion.

According to various exemplary embodiments, a device structure can be provided by providing a gate dielectric layer such as, for example, silicon nitride, on to a patterned metal film such as, for example, chromium, molybdenum-chrome, titanium-tungsten, or aluminum. According to various exemplary embodiments, the second dielectric layer is deposited and patterned to the dimensions and self-aligned to the gate electrode, and a thin doped silicon layer is then grown over the semiconductor film, thus creating a doped silicon surface. According to various exemplary embodiments, a source and drain contact electrode metal is then deposited over the doped silicon layer. The metal is then patterned and etched to define the top source and drain contacts of the thin-film transistor. The exposed doped silicon layer is etched, using the source and drain contacts as an etch mask. During the etching process, an edge defect is generated, and thus initiates delamination of the metal over the silicon nitride layer. According to various exemplary embodiments, the delamination can also be initiated by thermal or radiative annealing of the stressed film. Similarly, altering the geometry and roughness of a portion of the underlying surface may create an adhesion energy contrast at the interface with the overlying stressed film. Also, because the delamination is localized to the region above the top nitride layer, the separation between the source and drain contact pattern mask can be non-existent. During the delamination process, the separation between the source contact and the drain contact is defined by the length of the top nitride feature.

As an example, a residual stress measured in an exemplary doped silicon layer, a nitride dielectric and a chromium metal are −390 MPa, 302 MPa and 1.63 GPa, respectively. For a thin film transistor stack, the major contributor to the strain energy is the tensile stress in the chromium layer. Assuming the other stresses are negligible for the thin film transistor structure, an exemplary adhesive energy of the interface between the silicon doped layer and the nitride dielectric layer is calculated to be approximately 1.9 J/m$^2$).

The methods according to this invention also allow for, for instance, the selective delamination of MEMS structures. The dominant approach to releasing a MEMS structure in a controlled manner is to completely etch away a sacrificial release layer directly underneath the mechanical structure to be released. The advantages of a controlled delamination release according to this invention over this conventional technique are that i) it does not require deposition of a sacrificial layer which much must be completely etched away; ii) it does not require release holes in wide structures, which is required to shorten the etch time and reduce the anchor under-etch, and iii) it requires short etch times, so the anchors are not severely under-etched. Release holes are detrimental for stressed-metal electrical probes because they reduce the force, introduce crack initiation sites, and reduces electrical conductivity.

The condition to delaminate can also be achieved by increasing the energy release rate. Annealing can change both the intrinsic stress and the resulting strain energy due to thermal expansion mismatch (commonly used for bimorphs). Increasing the energy release rate to overcome the adhesive energy would allow for a controlled release of a structure through controlled delamination.

While the invention has been described in conjunction with exemplary embodiments, these embodiments should be viewed as illustrative, not limiting. Various modifications, substitutes, or the like are possible within the spirit and scope of the invention.

What is claimed is:

1. A method of separating a film from a substrate comprising:
   providing a first film on a substrate;
   providing a second film adjacent to the first film in a longitudinal direction, providing a stressed film over the first and second films, the stressed film having an adhesive energy to the first film lower than the adhesive energy of the stressed film to the second film;
initiating a delamination of the stressed film from the first film.

2. The method of claim 1, wherein initiating a delamination includes initiating a delamination by at least one of creating a defect at an interface between the stressed film and the first film by at least one of thermal and radiative annealing at least one of the first film and the stressed film.

3. The method of claim 1, wherein
a buffer layer is provided between the stressed film and the first and second films; and
the buffer layer is delaminated from the first film during delamination.

4. A method of separating a metal layer and a doped semiconductor layer from a dielectric layer in a structure that comprises the metal layer provided over the doped layer, the metal layer and the doped layer partially covering the dielectric layer, the method comprising:
initiating a delamination of the doped layer and overlaying metal layer from the dielectric film; and
separating the doped layer and overlaying metal layer from the dielectric layer by releasing a strain energy of at least one of the doped layer and the metal layer, the separation being initiated by an edge defect.

5. The method of claim 4, wherein initiating a delamination includes initiating a delamination by creating a defect at an interface between the doped layer and the dielectric film by at least one of thermal or radiative annealing of at least one of the doped layer and the dielectric film.

6. The method of claim 4, wherein the doped layer is a silicon doped layer.

7. The method of claim 4, wherein the metal layer is a chromium layer.

8. The method of claim 4, wherein at least a portion of the metal layer is a first electrode for a semiconductor device.

9. The method of claim 4, wherein at least a portion of the metal layer is a second electrode for a semiconductor device.

10. The method of claim 4, further comprising removing the separated doped layer and overlaying metal layer.

11. The method of claim 10, wherein removing the separated doped layer and overlaying metal layer is performed by rinsing.

12. The method of claim 4, wherein the dielectric layer is a nitride layer.

13. A method of producing a thin film transistor, the transistor comprising a doped layer covering a dielectric layer, and a metal layer covering at least a portion of the doped layer, a strain energy being stored in the metal layer, the method comprising:
initiating a delamination of the doped layer and overlaying metal layer from the dielectric layer; and
removing the delaminated doped layer and overlaying metal layer.

14. The method of claim 13, wherein initiating a delamination includes initiating a delamination by one of at least:
etching at least a portion of the doped layer that covers a central portion of the dielectric layer and that is not covered by the metal layer so as to create a defect at an interface between the doped layer and the dielectric layer;
thermally or radiatively annealing of one of the doped layer and the overlaying metal layer.

15. The method of claim 13, wherein removing the delaminated doped layer and overlaying metal layer is performed by rinsing.

16. The method of claim 13, wherein at least a portion of the metal layer is a source layer for a semiconductor device.

17. The method of claim 13, wherein at least a portion of the metal layer is a drain layer for a semiconductor device.

18. A self-aligned thin film transistor device, comprising:
a first patterned layer;
a first dielectric layer provided over the first patterned layer;
a semiconductor layer provided over the first dielectric layer;
a patterned second dielectric layer provided over at least a portion of the semiconductor layer, the patterned second dielectric layer being self-aligned to the first patterned layer;
a doped layer provided over a portion of the semiconductor layer that is not covered by the second dielectric layer, the doped layer being adjacent to at least one substantially vertical surface of the second dielectric layer; and
a patterned metal layer provided over the doped layer;
wherein any portion of the patterned metal layer and the doped semiconductor layer that covers any non-vertical portion of the second dielectric layer surface is removed by delamination.

19. The device of claim 18, wherein the delamination is initiated by one of at least:
a defect created at an interface between the doped layer and the second dielectric layer surface; and
a thermal or radiative annealing of the doped layer.

20. The device of claim 19, wherein the difference between a horizontal surface of the second dielectric layer and a horizontal surface of the semiconductor layer defines a step.

21. The device of claim 18, wherein an adhesive energy at an interface between the doped layer and the substantially vertical portion of the second dielectric layer is different from an adhesive energy at an interface between the doped layer and the semiconductor layer.

22. The device of claim 20, wherein an adhesive energy at an interface between the doped layer and the substantially vertical portion of the second dielectric layer is different from an adhesive energy between the doped layer and the portion of the second dielectric layer that defines the step.

23. The device of claim 22, wherein the adhesive energy at the interface between the doped layer and the substantially vertical portion of the second dielectric layer is smaller than the adhesive energy between the doped layer and the portion of the second dielectric layer that defines the step.

24. The device of claim 21, wherein the adhesive energy at the interface between the doped layer and the substantially vertical portion of the second dielectric layer is greater than the adhesive energy of the doped layer at the interface between the doped layer and the semiconductor layer.

25. The device of claim 18, wherein the surface of the second dielectric layer at the interface between the doped layer and the substantially vertical second dielectric layer surface is rougher than the surface of the portion of the second dielectric layer that defines the step.

26. The device of claim 18, wherein the semiconductor layer is an amorphous silicon layer.

27. The device of claim 18, wherein the adhesive energy at the interface between the doped layer and the second dielectric layer is substantially smaller than the adhesive energy of the doped layer at the interface between the doped semiconductor layer and the semiconductor layer.

28. The device of claim 18, wherein the adhesive energy between the doped layer and the semiconductor layer is greater than the adhesive energy between the doped layer and the second dielectric layer.

29. A self-aligned thin film transistor device, comprising:
a first patterned layer;
a semiconductor layer provided over the first patterned layer;
a first dielectric layer provided over at least a portion of the semiconductor layer;
a second dielectric layer provided over at least a portion of the semiconductor layer, the patterned second dielectric layer being self-aligned to the first patterned layer;
a stressed metal layer provided over the first dielectric layer and the semiconductor layer;
wherein a portion of the stressed metal layer provided over the second dielectric layer is delaminated and separates the metal layer from the semiconductor layer.

30. The device of claim 29, wherein the first dielectric layer is silicon nitride.

31. The device of claim 29, wherein the second dielectric layer is silicon dioxide.

32. The device of claim 29, wherein the first patterned layer is a bottom gate of the self-aligned thin film transistor device.

33. A method of separating a film from a substrate comprising:
providing a first film on a substrate;
providing a second film adjacent to the first film in a longitudinal direction, the second film having an adhesive energy to the substrate larger than an adhesive energy to the substrate of the first film;
providing a stressed film over the first and second films;
initiating a delamination of the first film and the stressed film from the substrate.

34. A method of separating a film from a substrate comprising:
altering at least one of the geometry and the roughness of a portion of the substrate;
providing a first stressed film on the substrate;
initiating a delamination of the stressed film from the substrate, an adhesive energy to the altered substrate area being lower than an adhesive energy to the unaltered substrate area.

* * * * *

UNITED STATES PATENT AND TRADEMARK OFFICE
CERTIFICATE OF CORRECTION

| | | |
|---|---|---|
| PATENT NO. | : 7,018,877 B1 | Page 1 of 1 |
| APPLICATION NO. | : 10/950413 | |
| DATED | : March 28, 2006 | |
| INVENTOR(S) | : William S. Wong et al. | |

It is certified that error appears in the above-identified patent and that said Letters Patent is hereby corrected as shown below:

Column 1, line 5, insert as a new paragraph:

This invention was made with Government support under 70NANB0H3033 awarded by NIST/ATP. The Government has certain rights in this invention.

Signed and Sealed this

First Day of May, 2007

JON W. DUDAS
*Director of the United States Patent and Trademark Office*

UNITED STATES PATENT AND TRADEMARK OFFICE
CERTIFICATE OF CORRECTION

PATENT NO.         : 7,018,877 B1                           Page 1 of 1
APPLICATION NO. : 10/950413
DATED              : March 28, 2006
INVENTOR(S)        : William Wong et al.

It is certified that error appears in the above-identified patent and that said Letters Patent is hereby corrected as shown below:

On The Title Page, Please delete the following:

Item "(73) Assignee:    Palo Alto Research Center, Palo Alto, CA (US)"

And Replace with the Following:

Item (73) Assignee:    Palo Alto Research Center Incorporated, Palo Alto, CA (US)

Signed and Sealed this

Seventh Day of April, 2009

JOHN DOLL
*Acting Director of the United States Patent and Trademark Office*